United States Patent [19]

Yoshida

[11] Patent Number: 4,785,249
[45] Date of Patent: Nov. 15, 1988

[54] METHOD FOR MEASURING DISTANCE IN DIGITAL DISTANCE RELAYS

[75] Inventor: Takashi Yoshida, Hyogo, Japan

[73] Assignee: Mitsubishi Denki Kabushiki Kaisha, Tokyo, Japan

[21] Appl. No.: 900,907

[22] Filed: Aug. 12, 1986

[30] Foreign Application Priority Data

Aug. 13, 1985 [JP] Japan ................................ 60-179640

[51] Int. Cl.$^4$ ............................................ G01R 31/08
[52] U.S. Cl. ..................................... 324/509; 324/522; 324/525; 361/80
[58] Field of Search ............... 324/415, 418, 509, 537, 324/555, 500, 525, 527, 522; 361/79, 80

[56] References Cited

U.S. PATENT DOCUMENTS

| 4,107,778 | 8/1978 | Nii et al. | 361/80 X |
| 4,344,143 | 8/1982 | Kurosawa et al. | 361/80 X |
| 4,568,872 | 2/1986 | Heller et al. | 324/522 |

FOREIGN PATENT DOCUMENTS

| 1538421 | 2/1970 | Fed. Rep. of Germany | 361/80 |
| 60-39312 | 3/1985 | Japan . | |

OTHER PUBLICATIONS

Oura et al., "Algorithm for New Type Distance Relay", Paper 1282 at National Conference of the Japan Society of Electric Engineering in 1985.

Primary Examiner—Reinhard J. Eisenzopf
Assistant Examiner—Robert W. Mueller
Attorney, Agent, or Firm—Bernard, Rothwell & Brown

[57] ABSTRACT

A method to detect voltage and current of an electric power system and, based on the detected values, calculate resistance and inductance of the power transmission line and thereby to measure the distance from the relay apparatus to the point of the fault of the power transmission line. The voltage (v) and current (i) of the electric power system are detected at constant sampling intervals and the thus detected values at the sampling time points from $t_n$ to $t_{n+2}$ are used in the approximate integration formula:

$$\int_{t_n}^{t_{n+2}} f(t)dt \approx T\left[k_1\left(\frac{f(t)}{2} + f(t_{n+1}) + \frac{f(t_{n+2})}{2}\right) + k_2\{f(t_n) + f(t_{n-2})\}\right]$$

where $K_1$ and $K_2$ are constants, and through this approximation the resistance (R) and inductance (L) of the power transmission line as the object of the measurement are obtained, and thus, even when a current including components of different frequencies is flowing through the power transmission line, the distance sought can be measured precisely.

4 Claims, 2 Drawing Sheets

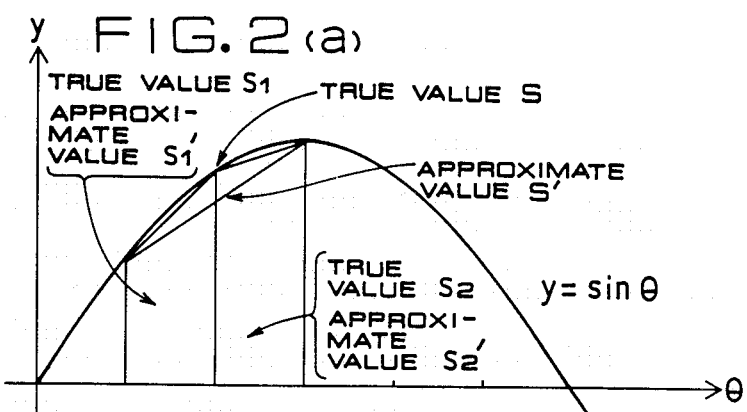
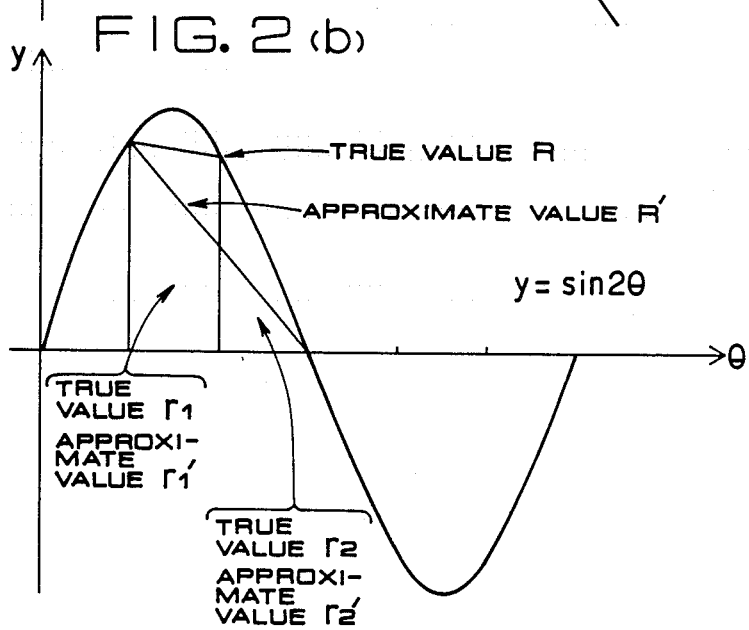

METHOD FOR MEASURING DISTANCE IN DIGITAL DISTANCE RELAYS

BACKGROUND OF THE INVENTION

1. Field of the Invention

The present invention relates to a method for measuring distance in a digital type distance relay which is applied to an electric power system.

2. Description of the Prior Art

There has been known a system used in a digital type distance relay apparatus of which working principle is based on the following relational formula among voltage v, current i, resistance R, and inductance L of a power transmission line, $$v = Ri + L\frac{di}{dt} \tag{1}$$

namely, simultaneous equations are set up with respect to R and L by providing the same with voltage and current values at two different time points, so that R and L are derived therefrom.

Concerning such a system, there are proposed one method to apply difference approximation to the differential term and another method to integrate both sides of the equation (1) to eliminate the differential term and thereafter to solve the then appearing integral term by approximation with the trapezoidal formula. While the equation (1) holds good regardless of the frequency of the voltage and current, since the differential or integral in the calculation is approximated with discrete values taken by sampling at constant time intervals as described above, it follows that the approximation formula has a frequency characteristic and as a result the thus calculated values of R and L also have a frequency characteristic. To improve such a frequency characteristic, the following methods have been proposed:

(I) "Protective Relay Apparatus", Japanese Patent Laid-open No. 60-39312 (1985); and (II) "Algorithm for New Type Distance Relay", by Oura et al., Paper 1282 at National Conference of the Japan Society of Electric Engineering in 1985.

Both of these relate to numerical approximation of the differential term in the equation (1), and the method (II) is such that is included in the method stated in (I) and the most simplified and practical type of the same.

In the prior art methods, however, errors were produced in a wider frequency range. In the method (II), for example, representing the sampling time points at constant intervals by $t_{n-2}$, $t_{n-1}$, $t_n$, $t_{n+1}$, ... and the sampled current values at the corresponding time points by $i_{n-2}$, $i_{n-1}$, $i_n$, $i_{n+1}$, ..., the current differential value, $i_{n-\frac{1}{2}}$ at the time point $t_{n-\frac{1}{2}}$ in the middle of the time points $t_n$ and $t_{n-1}$ is approximated by the following equation, $$i_{n-\frac{1}{2}} \approx k_1(i_n - i_{n-1}) + k_2(i_{n+1} - i_{n-2})$$

As apparent from this equation, data of four samples at least were required for differential approximation at one time point in the prior art method mentioned in (I) or (II) above, and since at least one sampling period had to be shifted in order that the values R and L were obtained by solving the simultaneous equations of the form of (1) set up for different time points, after all data of five samples were required. Since, on the other hand, a protective relay is required to make a correct decision of a fault the earliest possible, it has been desired that the number of samples for the data used in the calculation is as small as possible.

SUMMARY OF THE INVENTION

A primary object of the present invention is the provision of a method for distance measurement in a digital distance relay in which only a small number of sampling data are required and yet the approximation error in integration can be reduced in a wide frequency band including two frequencies.

According to the present invention, when the following equations (2) and (3) obtainable by integration of both sides of the equation (1) from time point $t_0$ to $t_2$ and from time point $t_1$ to $t_3$ and set up as simultaneous equations with respect to R and L are solved as the following equations (4) and (5) and the values of R and L are sought therefrom, the integral terms in the equations (4) and (5) are approximated by the below mentioned approximation formula (6), and it is thereby made possible to provide the method for distance measurement in a distance relay whose frequency characteristic is improved in a wide range as compared with the conventional simple approximation using the trapezoidal formula.

$$\int_{t_0}^{t_2} v\,dt = R \int_{t_0}^{t_2} i\,dt + L[i]_{t_0}^{t_2} \tag{2}$$

$$\int_{t_1}^{t_3} v\,dt = R \int_{t_1}^{t_3} i\,dt + L[i]_{t_1}^{t_3} \tag{3}$$

$$R = \frac{\int_{t_0}^{t_2} v\,dt \cdot [i]_{t_1}^{t_3} - \int_{t_1}^{t_3} v\,dt \cdot [i]_{t_0}^{t_2}}{\int_{t_0}^{t_2} i\,dt\,[i]_{t_1}^{t_3} - \int_{t_1}^{t_3} i\,dt \cdot [i]_{t_0}^{t_2}} \tag{4}$$

$$L = \frac{\int_{t_0}^{t_2} v\,dt \int_{t_1}^{t_3} i\,dt - \int_{t_1}^{t_3} v\,dt \int_{t_0}^{t_2} i\,dt}{\int_{t_1}^{t_3} i\,dt\,[i]_{t_0}^{t_2} - \int_{t_0}^{t_2} i\,dt\,[i]_{t_1}^{t_3}} \tag{5}$$

$$\int_{t_n}^{t_{n+2}} f(t)dt = T\left[ k_1 \left( \frac{f(t_n)}{2} + f(t_{n+1}) + \frac{f(t_{n+2})}{2} \right) + k_2 \{f(t_n) + f(t_{n+2})\} \right] \quad (6)$$

where $k_1$, $k_2$ are constants.

According to the above mentioned approximation formula (6), the approximation error in integration can be made to zero for two frequencies by determining the constants $k_1$ and $k_2$ in the later described way, and as the result, the approximation error in integration can be reduced for a range including two frequencies, and the frequency characteristic concerning the calculation error of the values of R and L can thereby be improved.

BRIEF DESCRIPTION OF THE DRAWINGS

FIGS. 2(a) and 2(b) are likewise for explaining the principle of the invention, in which FIG. 2(a) is a waveform chart showing a sine wave of an arbitrary single frequency and FIG. 2(b) is a waveform chart of the second harmonic sine wave of the sine wave of FIG. 2(a)

DESCRIPTION OF THE PREFERRED EMBODIMENT

Figure 1:
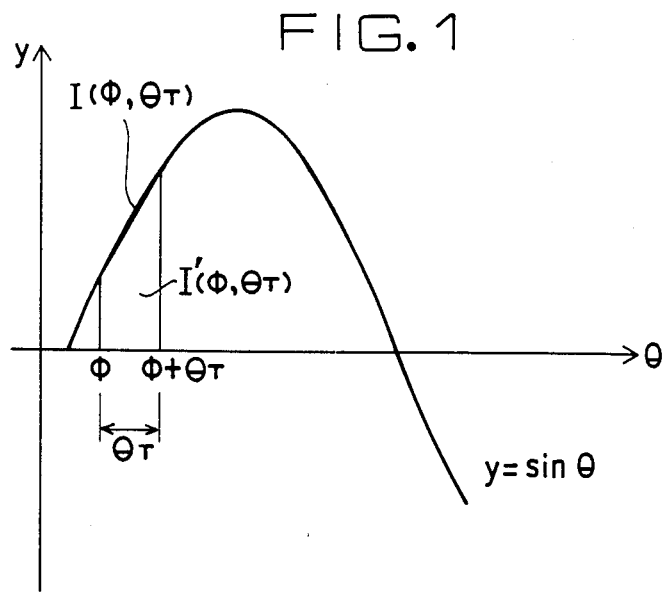
FIG. 1 is a waveform chart of a sine wave of an arbitrary single frequency for explaining the fundamental principle of the invention.

Below will be described the basic principle of the present invention and an embodiment thereof, which based on the principle makes the calculation error for fundamental frequency and second harmonic frequency in the electric power system zero. Referring to FIG. 1, which is an explanatory drawing of the principle, if a sine wave of an arbitrary single frequency is denoted by $y = \sin\theta$, an arbitrary sampling phase angle is denoted by $\phi$, and the phase difference corresponding to the sampling interval is denoted by $\theta_T$, and if the true integral value of the function y from the phase angle $\phi$ to $\phi + \theta_T$ is represented by $I(\phi, \theta_T)$ and the approximate integral value obtained by the trapezoidal formula is represented by $I'(\phi, \theta_T)$, then they will be expressed as the following equations (7) and (8).

$$I(\phi, \theta_T) = \int_{\phi}^{\phi+\theta_T} \sin\theta d\theta = 2\sin\frac{\theta_T}{2} \sin\left(\phi + \frac{\theta_T}{2}\right) \quad (7)$$

$$I'(\phi, \theta_T) = \frac{1}{2}\theta_T[\sin\phi + \sin(\phi + \theta_T)] \quad (8)$$

$$= \theta_T \sin\left(\phi + \frac{\theta_T}{2}\right)\cos\frac{\theta_T}{2}$$

From the equations (7) and (8), the ratio of the approximate integral value to the true integral value, represented by $K(\phi, \theta_T)$, will be expressed as $$K(\phi, \theta_T) = \frac{I'(\phi, \theta_T)}{I(\phi, \theta_T)} = \frac{\theta_T}{2} \frac{\cos\frac{\theta_T}{2}}{\sin\frac{\theta_T}{2}} \quad (9)$$

The equation (9) indicates that K is independent of the sampling phase $\phi$ and a constant determined by the sampling interval $\phi_T$, and it is known from the same that, in approximate integral by the trapezoidal formula for a sine wave of a single frequency, the true value can be obtained by multiplying the inverse number of $K(\phi_T)$. However, since the sampling interval appears to change when the frequency changes, there occurs some error.

The fact that integration free from errors can be performed for two different frequencies by the principle of the present invention will be described in the following. The sampling is made to be conducted at the intervals corresponding to 30° with respect to the fundamental wave. Referring to FIG. 2(a), if the true integral values at the intervals of 30° with respect to the fundamental wave are denoted by $s_1$ and $s_2$, the corresponding approximate values by the trapezoidal formula are denoted by $s_1'$ and $s_2'$, the true integral value in the total 60° demain is denoted by S, and the corresponding approximation by the trapezoidal formula is denoted by S', and referring to FIG. 2(b), the true integral values with respect to the second harmonic wave at the same sampling intervals (i.e., at 60° intervals for this waveform) are denoted by $r_1$ and $r_2$, the corresponding approximate values by the trapezoidal formula are denoted by $r_1'$ and $r_2'$, the true integral value in the total 120° domain is denoted by R, and the corresponding approximation by the trapezoidal formula is denoted by R', then apparently the following equations (10)–(13) hold from the condition indicated in the equation (9) and FIGS. 2(a) and (b).

$$S' = K(60°)S = 0.907S \quad (10)$$

$$s'_1 + s'_2 = K(30°)\{s_1 + s_2\} = 0.977S \quad (11)$$

$$R' = K(120°)R = 0.605R \quad (12)$$

$$r'_1 + r'_2 = K(60°)\{r_1 + r_2\} = 0.907R \quad (13)$$

From these, it is considered to obtain S and R as combined values of the sum of the integrals, $s_1' + s_2'$ and $r_1' + r_2'$, for the individual sampling intervals and the integral S' and R' for the domain of two sampling intervals lumped together as indicated in the following equations (14) and (15).

$$k_1(s'_1 + s'_2) + R_2 S' = S \quad (14)$$

$$k_2(r'_1 + r'_2) + R_2 R' = R \quad (15)$$

Substituting the equations (10) through (13) in the equations (14) and (15) we obtain $$0.977k_1 + 0.907k_2 = 1 \quad (16)$$

$$0.907k_1 + 0.605k_2 = 1 \quad (17)$$

and thus, it is known that, by determining $k_1$ and $k_2$ so that the equations (16) and (17) may be satisfied, the true value R for the second harmonic wave can be obtained from the equation (15) while S is obtained from the equation (14).

Denoting the function as the object of integration by f(t) and a series of sampling time points by $t_0, t_1, t_2, \ldots$ and expressing each of $s_1'$, $s_2'$, and $S'$ in approximation by the trapezoidal formula, the approximate integration equation (18) according to the present invention is given as $$\int_{t_0}^{t_2} f(t)dt \approx k_1\left[\frac{T}{2}\{f(t_0) + f(t_1)\} + \frac{T}{2}\{f(t_1) + f(t_2)\}\right] + \quad (18)$$

$$k_2\left[\frac{T}{2}\{f(t_0) + f(t_2)\}\right] \approx T\left[k_1\left(\frac{f(t_0)}{2} + f(t_1) + \frac{f(t_2)}{2}\right) + k_2\{f(t_0) + f(t_2)\}\right]$$

When the ratio of the integral approximation to the true integral value is expressed by a constant K regardless of the sampling phase as indicated in the equation (9), the calculated values R' and L' by this approximate integration of R and L expressed by the equations (4) and (5) will, as apparent from the form of the equations, become $$R' = \frac{K}{K} R = R \quad (19)$$

$$L' = \frac{K^2}{K} L = K \cdot L \quad (20)$$

and it is known that, for a single frequency, R can always be calculated free from error and L can be obtained with the same degree of approximation as K, the degree of approximation of the integration. Thus, if the error in the approximation of the integration is improved, the error in the approximation of L can accordingly be improved.

Figure 3:
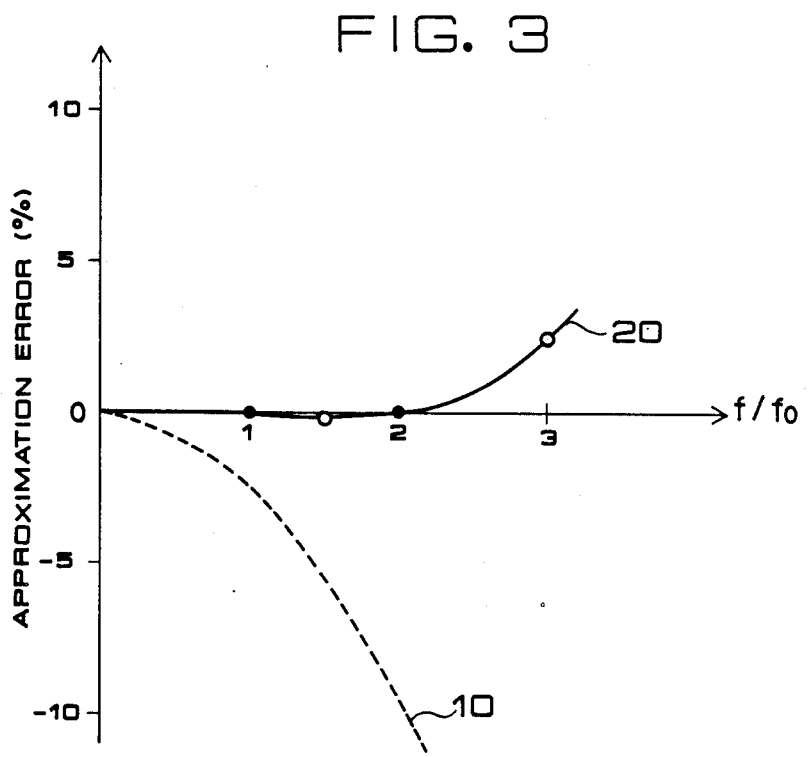
FIG. 3 is a graph showing an improved frequency characteristic in integral approximation provided by the present invention in contrast with approximation error in the differential approximation of the prior art using the trapezoidal formula.

Results of the improvement in the approximation error by the present embodiment are shown in FIG. 3. Referring to FIG. 3, the solid line 20 is a characteristic curve indicating the approximation errors in the present embodiment for sampling intervals and there is produced no error as seen at the points 1 and 2, in contrast to the approximation error in the prior art indicated by the dotted line 10.

As described above, the frequency characteristic is improved by the present invention in a wide range as compared with the approximation of the prior art by the trapezoidal formula.

According to the present invention, three samples are enough for performing an improved approximate integral, and the improvement of characteristic is made possible by fewer data than in the differential approximation.

Since the hardware structure for the present embodiment of the invention is similar to the ordinary digital relay employing a microprocessor, the block diagram thereof is omitted.

Although, in the above description of the embodiment, the one in which $k_1$ and $k_2$ are determined so that the error may be made to zero for a fundamental frequency and its second harmonic frequency, it is apparent that $k_1$ and $k_2$ can be determined for other specific frequencies by following similar procedure. And, although the present invention is primarily directed to improvement of approximate integral for two frequencies in view of practicability thereof, it is readily conceived of to attain improvement in the approximation by applying the idea of the present method to a combination of integrals by the trapezoidal formula for n sampling intervals when n frequencies are handled.

The voltage and current were not specifically discussed in the above description, while, in the ordinary three-phase power systems, the input to a short-circuit relay is supplied with a line current, and as for a ground relay, the phase voltage and the phase current compensated by the zero-phase current are used. It, however, is theoretically well known that the principle in the present invention is applicable to such voltage and current which are used as inputs to the conventional relays.

According to the present invention as described above, the error in a wide range of frequency is made remarkably smaller than that in the prior art method, and the number of data samples required for approximation can be made smaller than in the case where it is attempted to achieve the same effect by differential approximation and therefore the response of the relay can be improved.

What is claimed is:

1. A method for measuring distance in a digital distance relay apparatus comprising the steps of:
   sampling voltage (v) and current (i) of an electric power system in a series of sampling time points at constant sampling intervals;
   obtaining the following two equations from a formula "v=Ri+Ldi/dt", among said voltage (v) and current (i) and resistance (R) and inductance (L) of a power transmission line, $$\int_{t_0}^{t_2} vdt = R\int_{t_0}^{t_2} idt + L[i]_{t_0}^{t_2}$$

$$\int_{t_1}^{t_3} vdt = R\int_{t_1}^{t_3} idt + L[i]_{t_1}^{t_3}$$

where $t_0, t_1, t_2, t_3, \ldots$ are a series of the sampling time points;
approximating an integral calculation, $$\int_{t_n}^{t_n+2} f(t)dt,$$

in the two immediately preceding equations by the following approximation formula and thereby obtaining said resistance R and inductance L from said equations $$\int_{t_n}^{t_{n+2}} f(t)dt \approx T\left[k_1\left(\frac{f(t_n)}{2} + f(t_{n+1}) + \right.\right.$$

$$\left. \frac{f(t_{n+2})}{2} \right\} + k_2\{f(t_n) + f(t_{n+2})\} \right]$$

where $k_1$, $k_2$ are constants;

subjecting the voltage and current of the power transmission line to sample hold at said constant sampling intervals to provide detected values;

digitizing the detected values to provide digitized signals; and performing the integral calculation based on such digital signals to determine the resistance (R) and inductance (L) of said power transmission line.

2. A method for measuring distance in a digital distance relay apparatus according to claim 1, wherein each sampling interval of said voltage (v) and current (i) is 30° for a fundamental wave and the same sampling interval is applied to a second harmonic of said fundamental wave, i.e, the sampling interval for the second harmonic is 60°, and thereby the integral calculation is performed and the resistance (R) and inductance (L) of the power transmission line are provided.

3. A method for measuring distance in a digital distance relay apparatus according to claim 1, wherein voltage and current of the power transmission line are subjected to sample hold at said constant sampling intervals by a voltage detecting device and current detecting device, respectively, and values determined by said detecting devices are digitized by analog-to-digital converting circuits, and the integral calculation is performed based on digital signals from said converting circuits to determine the resistance (R) and inductance (L) of said power transmission line.

4. A method for measuring distance in a digital distance relay apparatus according to claim 1, wherein voltage and current of the power transmission line converted to digital signals by analog-to-digital converting circuits are subjected to the integral calculation by integrating circuits incorporated in a central processing unit of a microcomputer and the resistance (R) and inductance (L) of said power transmission line are determined.

* * * * *

UNITED STATES PATENT AND TRADEMARK OFFICE
CERTIFICATE OF CORRECTION

PATENT NO.  : 4,785,249

DATED       : November 15, 1988

INVENTOR(S) : Takashi Yoshida

It is certified that error appears in the above-identified patent and that said Letters Patent is hereby corrected as shown below:

Column 2, at the beginning of equation (2), insert -- $\int$ --.

Column 2, at the beginning of equation (3), insert -- $\int$ --.

Signed and Sealed this

Twenty-fourth Day of October, 1989

*Attest:*

DONALD J. QUIGG

*Attesting Officer*  *Commissioner of Patents and Trademarks*